(12) United States Patent
Tateishi

(10) Patent No.: US 6,448,151 B2
(45) Date of Patent: Sep. 10, 2002

(54) PROCESS FOR PRODUCING A LARGE NUMBER OF SEMICONDUCTOR CHIPS FROM A SEMICONDUCTOR WAFER

(75) Inventor: Toshiyuki Tateishi, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 09/817,248

(22) Filed: Mar. 27, 2001

(30) Foreign Application Priority Data

Apr. 4, 2000 (JP) ........................................ 2000-102632

(51) Int. Cl.[7] .............................................. H01L 21/30
(52) U.S. Cl. ...................... 438/458; 438/460; 438/462; 438/977
(58) Field of Search ................................ 438/458, 460, 438/462, 977

(56) References Cited

U.S. PATENT DOCUMENTS 5,998,238 A * 12/1999 Kosaki ........................ 438/113
6,294,439 B1 * 9/2001 Sasaki et al. ................ 438/113

\* cited by examiner

Primary Examiner—Richard Elms
Assistant Examiner—Christian D. Wilson
(74) Attorney, Agent, or Firm—Smith, Gambrell & Russell, LLP

(57) ABSTRACT

A process for producing a large number of semiconductor chips from a semiconductor wafer having a large number of rectangular areas defined by streets arranged on the front surface in a lattice form, semiconductor circuits being formed in the respective rectangular areas. This process comprises the steps of forming a plurality of grooves having a predetermined depth in the back surface of the semiconductor wafer, grinding the back surface of the semiconductor wafer to reduce the thickness of the semiconductor wafer to a predetermined value and thereafter, cutting the semiconductor wafer along the streets to separate the rectangular areas from one another to obtain semiconductor chips.

6 Claims, 3 Drawing Sheets

PROCESS FOR PRODUCING A LARGE NUMBER OF SEMICONDUCTOR CHIPS FROM A SEMICONDUCTOR WAFER

FIELD OF THE INVENTION

The present invention relates to a process for producing semiconductor chips from a semiconductor wafer and, more specifically, to a process for producing a large number of semiconductor chips from a semiconductor wafer having a large number of rectangular areas defined by streets arranged on the surface in a lattice form, semiconductor circuits being formed in the respective rectangular areas.

DESCRIPTION OF THE PRIOR ART

As known to people of ordinary skill in the art, in the production of semiconductor chips, streets are arranged on the surface of a semiconductor wafer in a lattice form to define a large number of rectangular areas, and semiconductor circuits are formed in the respective rectangular areas. Then, the back surface of the semiconductor wafer is ground to reduce the thickness of the semiconductor wafer to a predetermined value. Thereafter, the semiconductor wafer is cut along the streets to separate the rectangular areas from one another to obtain semiconductor chips.

The production of semiconductor chips in the prior art, however, has the following problems to be solved. That is, the grinding of the back surface of the semiconductor wafer is generally carried out by applying a rotary grinding wheel to the back surface of the semiconductor wafer. The rotary grinding wheel comprises a grinding means containing diamond grains, and this grinding means has a substantially flat grinding surface which is pressed against the back surface of the semiconductor wafer. When the back surface of the semiconductor wafer is ground, a cooling liquid such as pure water is jetted over the area to be ground. However, since the grinding surface of the grinding means is substantially flat, the cooling liquid cannot be jetted over the area to be ground sufficiently, and an undesired burn may be formed on the ground back surface of the semiconductor wafer. Further, chippings may not be discharged well from the area to be ground, thereby causing reduction of grinding efficiency.

Further, the cutting of the semiconductor wafer along the streets is generally carried out by applying the rotary cutting blade to the front surface of the semiconductor wafer. At this time, fine chippings may be formed on the back surface of the semiconductor.

SUMMARY OF THE INVENTION

It is therefore the principal object of the present invention to enable to grind the back surface of a semiconductor wafer fully effectively by preventing and suppressing the formation of a burn on the back surface.

It is another object of the present invention to prevent and suppress the formation of chippings on the back surface of the semiconductor chip when a rotary cutting blade is applied to the front surface of the semiconductor wafer to cut the semiconductor wafer along the streets.

According to the present inventor, the above principal object can be attained by a process for producing a large number of semiconductor chips from a semiconductor wafer having a large number of rectangular areas defined by streets arranged on the surface in a lattice form, a semiconductor circuit being formed in each of the rectangular areas, wherein a plurality of grooves having a predetermined depth are formed in the back surface of the semiconductor wafer, then the back surface of the semiconductor wafer is ground to be reduced the thickness of the semiconductor wafer to a predetermined value, and thereafter, the semiconductor wafer is cut along the streets to separate the rectangular areas from one another to obtain semiconductor chips.

In a preferred embodiment of the present invention, the grooves are formed by cutting the semiconductor wafer to a predetermined depth from the back surface with the rotary cutting blade, a grinding means having a substantially flat grinding surface is applied to the back surface of the semiconductor wafer to grind the back surface of the semiconductor wafer, and a rotary cutting blade is applied to the front surface of the semiconductor wafer to cut the semiconductor wafer along the streets. The another object is attained by forming the grooves corresponding to the streets in such a manner that the grooves have a depth larger than the grinding depth of the back surface of the semiconductor wafer and the grooves are still existent even after the back surface of the semiconductor wafer is ground. The width of the grooves is preferably larger than the cutting width at the point when the semiconductor wafer is cut along the streets.

DETAILED DESCRIPTION OF THE PREFERRED EMBODIMENTS

Preferred embodiments of the present invention will be described in detail hereinafter with reference to the accompanying drawings.

Figure 1:
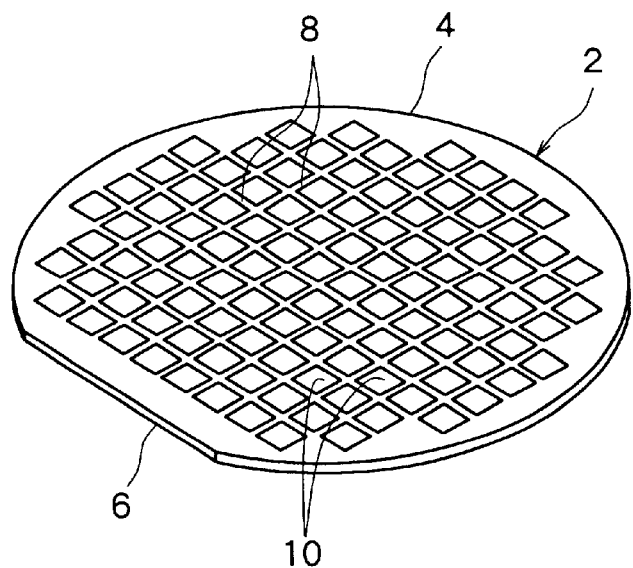
FIG. 1 is a perspective view showing a typical example of a semiconductor wafer to which the present invention is applied.

FIG. 1 shows a typical example of a semiconductor wafer to which the present invention is applied. The illustrated semiconductor wafer 2 that has a known per se shape has a substantially disk-like shape as a whole, and its peripheral edge includes a circular arc main portion 4 and a straight portion 6 which is relatively short and called "orientation flat". Streets 8 are arranged on the front surface of the semiconductor wafer 2 in a lattice form to define a large number of rectangular areas 10. A semiconductor circuit (its detailed illustration is omitted) is formed in each of the rectangular areas 10.

Figure 2:
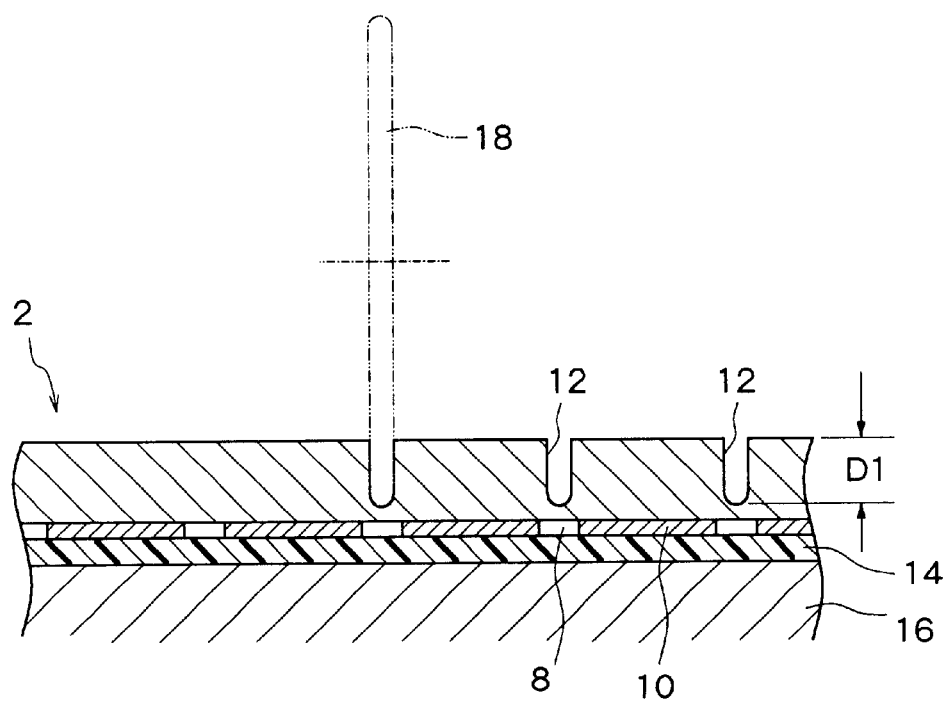
FIG. 2 is a sectional view for explaining how to form grooves in the back surface of the semiconductor wafer of FIG. 1.
Figure 3:
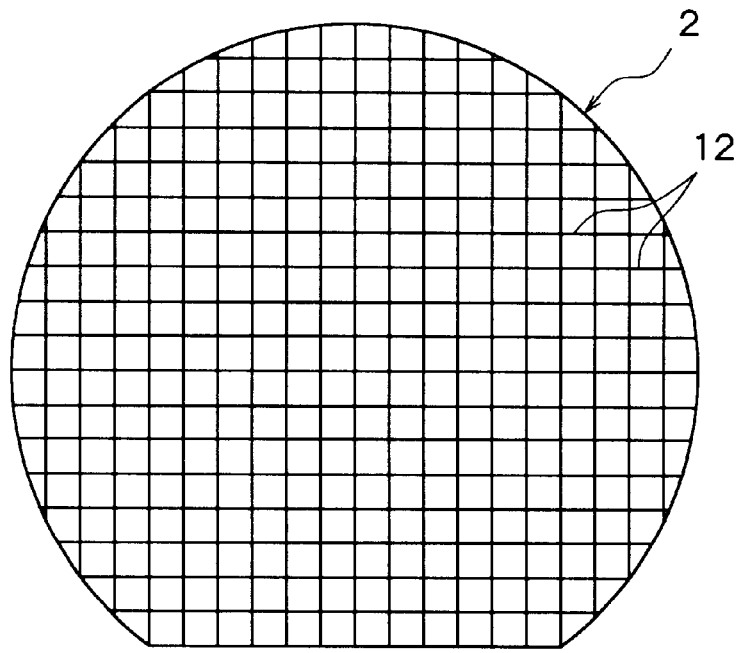
FIG. 3 is a bottom view of the semiconductor wafer having grooves formed in the back surface.

Describing with reference to FIG. 2 together with FIG. 1, in the process of the present invention, a plurality of grooves 12 are formed in the back surface of the semiconductor wafer 2. The formation of the grooves 12 can be carried out advantageously as shown in FIG. 2. Prior to the formation of the grooves 12, a protective film 14 which may be an appropriate synthetic resin film is bonded to the front surface of the semiconductor wafer 2. The semiconductor wafer 2 having the protective film 14 bonded to its front surface is turned upside down (that is, the back surface faces up) and secured on a chuck 16. A rotary cutting blade 18 which is caused to rotate on a center axis extending substantially in a horizontal direction at a high speed is applied to a predetermined depth D1 from the back surface of the semiconductor wafer 2, and the chuck 16 and the rotary cutting blade 18 are moved substantially horizontally in a predetermined direction relative to each other. Preferably, the chuck 16 has a vacuum suction groove or hole in the front surface so as to vacuum adsorb the semiconductor wafer 2 to its front surface. The rotary cutting blade 18 preferably may be a thin disk shaped blade that is formed by incorporating diamond grains into an electrodeposited metal. As shown in FIG. 3, it is desirable that the grooves 12 formed in the back surface of the semiconductor wafer 2 are arranged in a lattice form so as to fully precisely correspond to the streets 8 arranged on the front surface of the semiconductor wafer 2 in a lattice form. In order to form the grooves 12 corresponding to the streets 8, it is necessary to detect with high accuracy the positions of the streets 8 arranged on the front surface of the semiconductor wafer 2 which is fixed on the chuck 16 and turned upside down. For example, the positions of the streets 8 can be detected with high accuracy by imaging the semiconductor wafer 2 on the chuck 7 with an infrared camera (not shown) and analyzing the image.

The above step of forming the grooves 12 in the back surface of the semiconductor wafer 2 can be advantageously carried out by a dicing saw which is marketed by Disco Corporation which is located in Tokyo, Japan under the trade name of DFD641 or DFD681.

Figure 4:
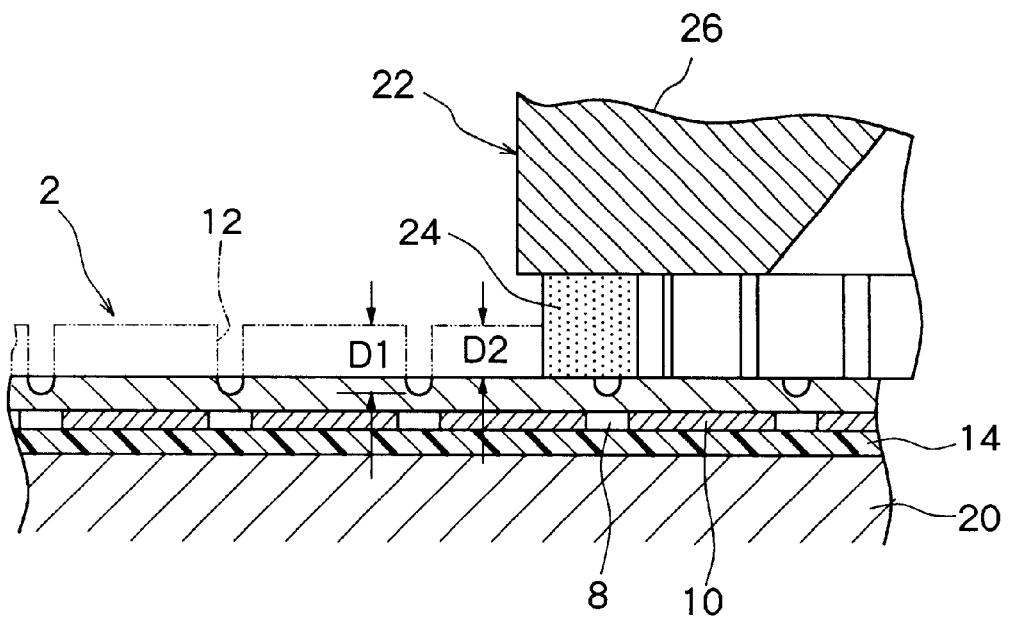
FIG. 4 is a sectional view for explaining how to grind the back surface of the semiconductor wafer having grooves formed in the back surface.

In the process of the present invention, after the grooves 12 are formed in the back surface of the semiconductor wafer 2, the back surface of the semiconductor wafer 2 is ground to reduce the thickness of the semiconductor wafer 2 to a predetermined value. This grinding can be advantageously carried out as shown in FIG. 4. The semiconductor wafer 2 having the protective film 14 bonded to the front surface is turned upside down and fixed on the chuck 20. Preferably, the chuck 20 vacuum adsorbs the semiconductor wafer 2 to its front surface. While the chuck 20 is turned on the center axis extending substantially vertically, the grinding means 24 of a grinding wheel 22 which is rotated on a center axis extending substantially vertically at a high speed are pressed against the back surface of the semiconductor wafer 2 held on the chuck 20 and gradually lowered to grind the back surface of the semiconductor wafer 2. The grinding wheel 22 includes an annular support member 26, and a plurality of grinding means 24 extending in an arc form and fixed to the undersurface of the support member 26. The plurality of grinding means 24 is from a ring as a whole. In place of the plurality of grinding means 24 fixed to the undersurface of the support member 26, an annular grinding means extending continuously in a circumferential direction may be fixed to the undersurface of the support member 26. The cross sectional form of each of the grinding means 24 is substantially rectangular and has a substantially flat undersurface, that is, grinding surface. The grinding means 24 are advantageously formed by bonding diamond grains by an appropriate bonding material such as a resin bond. The grinding depth (i.e., thickness removed by grinding) D2 of the back surface of the semiconductor wafer 2 is somewhat smaller than the depth D1 of the grooves 12 formed in the back surface of the semiconductor wafer 2. Therefore, even after the back surface of the semiconductor wafer 2 is ground, the grooves 12 are preferably still existent in the back surface of the semiconductor wafer 2. For example, when the semiconductor wafer 2 having a thickness of 300 $\mu$m is to be ground by a thickness of 100 $\mu$m, the depth of the grooves 12 may be about 110 to 120 $\mu$m.

Heretofore, the back surface of the semiconductor wafer 2 has been ground without forming the grooves 12 in the back surface of the semiconductor wafer 2. In this case, a cooling liquid such as pure water to be jetted at the time of grinding could not fully go into the grinding area due to the substantially flat grinding surface of the grinding means 24, whereby an undesired burn was liable to be formed on the ground back surface of the semiconductor wafer 2. Further, chippings formed by grinding could not be discharged well from the grinding area, thereby causing reduction of grinding efficiency. In contrast to this, in the process of the present invention, prior to the grinding of the back surface of the semiconductor wafer 2, a plurality of grooves 12 are formed in the back surface of the semiconductor wafer 2. The existence of the grooves 12 prevents or suppresses the formation of the undesired burn and promotes the discharge of chippings.

The above-mentioned step of grinding the back surface of the semiconductor wafer 2 can be advantageously carried out by a surface grinder which is marketed by Disco Corporation under the trade name of DFG841.

Figure 5:
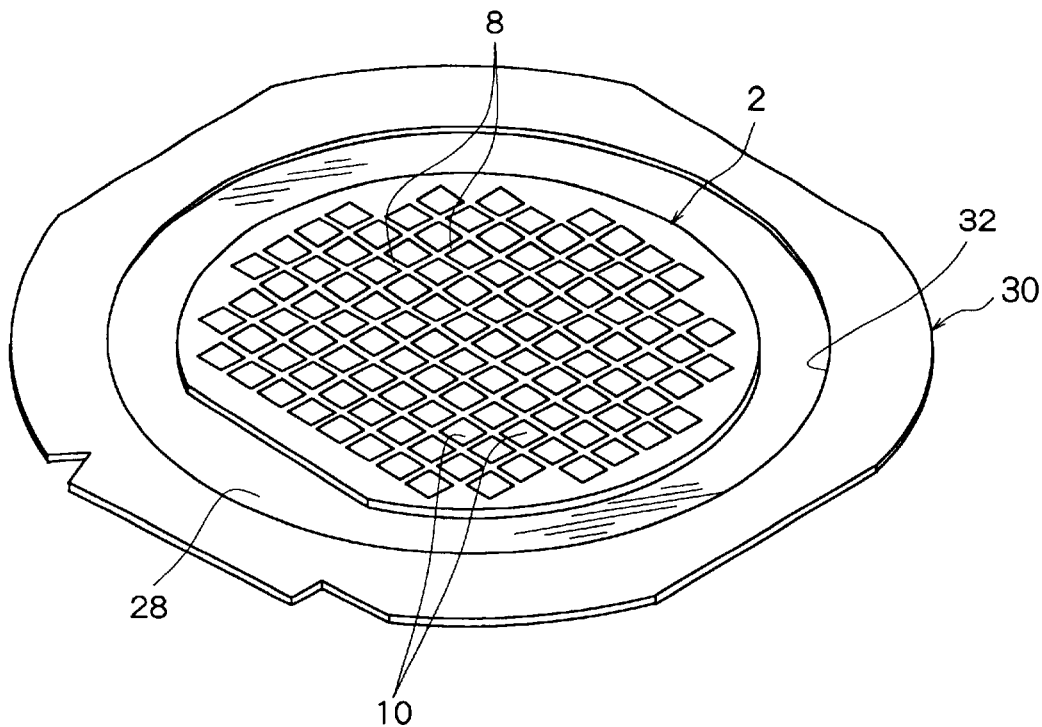
FIG. 5 is a perspective view showing a state that a semiconductor wafer which has grooves in the back surface and whose back surface has been ground is mounted on a frame through a mounting tape.
Figure 6:
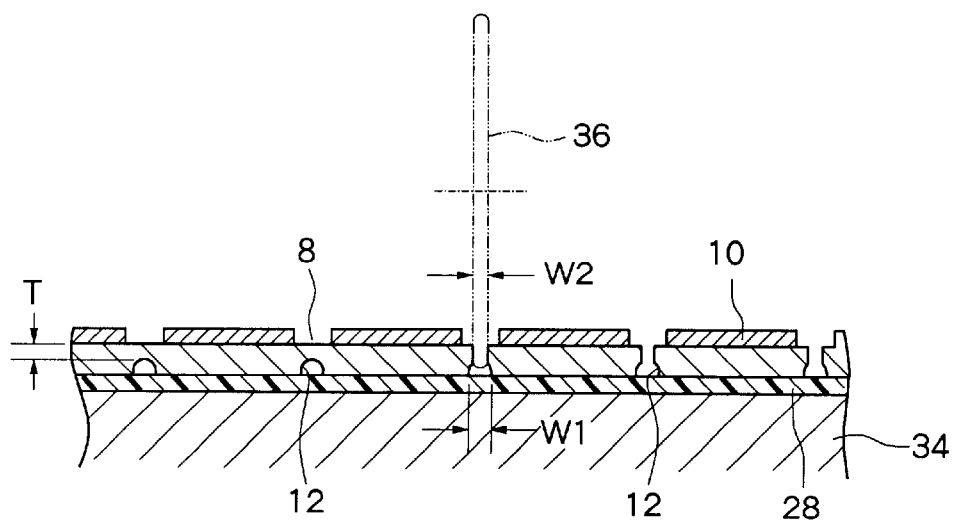
FIG. 6 is a sectional view showing how to cut the semiconductor wafer which has grooves formed in the back surface and whose back surface has been ground, along streets.

After the grinding of the back surface of the semiconductor wafer 2, the semiconductor wafer 2 is cut along the streets 8 arranged on the front surface to separate the rectangular areas from one another to produce semiconductor chips. Preferably, it is advantageous that prior to the cutting of the semiconductor wafer 2, as shown in FIG. 5, the protective film 14 is peeled off from the front surface of the semiconductor wafer 2 and the semiconductor wafer 2 is required. The frame 30 which can be formed from a synthetic resin or a metal plate has a relatively large circular opening 32 in the center. The semiconductor wafer 2 is positioned in the opening 32 of the frame 30 and the tape 28 extending across the opening 32 of the frame 30 is affixed to the back surface of the frame 30 and the back surface of the semiconductor wafer 2 to mount the semiconductor wafer 2 on the frame 30. The cutting of the semiconductor wafer 2 can be advantageously carried out as shown in FIG. 6. The semiconductor wafer 2 mounted on the frame 30 through the tape 28 is held on the chuck 34. The rotary cutting blade 36 which is rotated on the center axis extending substantially horizontally at a high speed is applied to a depth somewhat larger than the thickness T of from the front surface of the semiconductor wafer 2 to the. bottom surface of the groove 12 formed in the back surface, and the chuck 34 and the rotary cutting blade 36 are moved along the streets 8 relative to each other. The cutting width W2 of the rotary cutting blade 36 is preferably somewhat smaller than the width W1 of the groove 12. For instance, when the cutting width W2 is 15 $\mu$m, the width W1 of the groove 12 is preferably about 30 $\mu$m. Preferably, the chuck 34 vacuum adsorbs the semiconductor wafer 2 to its front surface. The rotary cutting blade 36 preferably may be a thin disk-shaped blade that is formed by incorporating diamond grains into an electrodeposited metal. In the illustrated embodiment, even when the semiconductor wafer 2 is cut along the streets 8 to separate the rectangular areas 10 from one another, the tape 28 is not cut and hence, each rectangular area, that is, the semiconductor chip is affixed to the tape and kept mounted on the frame 30.

When the semiconductor wafer 2 is cut along the streets 8 as described above after the grooves 12 corresponding to the streets 8 arranged on the front surface of the semiconductor wafer 2 are formed in the back surface of the semiconductor wafer 2, as shown in FIG. 6, it has been ascertained that the formation of chippings formed on the back surface of the semiconductor wafer 2 can be prevented and suppressed effectively. When the semiconductor wafer 2 is to be cut along the streets 8, the rotary cutting blade 36 does not need to be contacted to or brought close to the top surface of the tape 28, whereby the adhesion of an adhesive applied to the front surface of the tape 28 to the rotary cutting blade 36 can be prevented without fail. When the adhesive is stuck to the rotary cutting blade 36, the rotary cutting blade 36 may be deteriorated in a short period of time.

The above step of cutting the semiconductor wafer 2 along the streets 8 can be advantageously carried out by a dicing saw which is marketed by Disco corporation under the trade name of DFD641 or DFD681, like the aforesaid step of forming the grooves.

While preferred embodiments of the invention have been descried in detail with reference to the accompanying drawings, it should be understood that the invention is not limited thereto and can be changed or modified without departing from the spirit and scope of the invention.

What is claimed is:

1. A process for producing a large number of semiconductor chips from a semiconductor wafer having a large number of rectangular areas defined by streets arranged on a front surface in a lattice form, a semiconductor circuit being formed in each of the rectangular areas, said process steps comprising:

a plurality of grooves having a predetermined depth are cut in a back surface of the semiconductor wafer;

the back surface of the semiconductor wafer is ground to reduce to the thickness of the semiconductor wafer to a predetermined value; and the semiconductor wafer is cut along the streets to separate the rectangular areas from one another and thereby obtain semiconductor chips.

2. The process of claim 1, wherein the semiconductor wafer is cut from the back surface to a predetermined depth with a rotary cutting blade to form the grooves.

3. The process of claim 1, wherein a grinding means having a substantially flat grinding surface is applied to the back surface of the semiconductor wafer to grind the back surface of the semiconductor wafer.

4. The process of claim 1, wherein a rotary cutting blade is applied from the front surface of the semiconductor wafer to cut the semiconductor wafer along the streets.

5. The process of claim 4, wherein the grooves the grooves corresponding to the streets are formed, the depth of the grooves is larger than a grinding depth of the back surface of the semiconductor wafer, and the grooves are still existent after the back surface of the semiconductor wafer is ground.

6. The process of claim 5, wherein a width of the grooves is larger than a cutting width at the time when the semiconductor wafer is cut along the streets.

* * * * *